(12) United States Patent
Gal-Or et al.

(10) Patent No.: US 6,258,237 B1
(45) Date of Patent: Jul. 10, 2001

(54) ELECTROPHORETIC DIAMOND COATING AND COMPOSITIONS FOR EFFECTING SAME

(75) Inventors: Leah Gal-Or, Haifa; Rony Goldner, Mizpe Adi; Nina Sezin, Haifa; David Brandon, Haifa; Shai Gilboa, Haifa; Albir A. Layyous, Upper Galilee, all of (IL)

(73) Assignees: Cerd, Ltd., Nesher; Iscer, Ltd., Tefen, both of (IL)

( * ) Notice: Subject to any disclaimer, the term of this patent is extended or adjusted under 35 U.S.C. 154(b) by 0 days.

(21) Appl. No.: 09/222,934

(22) Filed: Dec. 30, 1998

(51) Int. Cl.$^7$ .......................... B01D 57/02; B01D 59/42; B01D 59/50; B01D 61/42; B01D 61/58

(52) U.S. Cl. .................... 204/548; 204/551; 204/489; 204/450

(58) Field of Search .................... 264/29.1; 428/426; 427/577; 205/104, 530, 531, 471, 548, 551, 489, 573, 450

(56) References Cited

U.S. PATENT DOCUMENTS

| | | | |
|---|---|---|---|
| 3,936,577 | * | 2/1976 | Christini ................. 428/426 |
| 5,128,006 | * | 7/1992 | Mitchell ................. 204/181.5 |
| 5,273,788 | * | 12/1993 | Yu ........................ 427/554 |
| 5,277,940 | * | 1/1994 | Caballero ................. 427/577 |
| 5,532,495 | | 7/1996 | Bloomquist et al. . |
| 5,725,408 | | 3/1998 | Boettcher . |
| 5,739,637 | | 4/1998 | Boettcher . |
| 5,756,218 | | 5/1998 | Buchheit et al. . |
| 5,769,154 | | 6/1998 | Adkins et al. . |
| 6,059,949 | * | 5/2000 | Gal-Or .................. 204/484 |

OTHER PUBLICATIONS

GB–173R Diamond, Diamond–Like and CBN Films and Coated Products: Materials, Processing, Application, Foreign Competition and Markets; Thomas Abraham, Ph.d, No Date Available.

GB–173T Diamond, Diamond–Like and CBN Films and Coated Products; Thomas Abraham, Ph.d, No Date Available.

Diamond, Diamond–Like Carbon and CBN Films and Coated Products in the U.S. Market Overview and New Developments Technology; From Business Communications Company , Feb., 1997.

Diamond, Diamond–Like Carbon and CBN Films and Coated Products—Market Overview, Technology, Production Techniques, Applications and Industry structure; From Business Communications Company, Dec., 1996. 6.1.7.

Diamond, Diamond–Like Carbon and CBN Films and Coated Products—Market Overview, Technology. Production Techniques, Applications and Industry structure; From Business Communications Company, Dec., 1996 6.1.5.

Diamond–Ceramic Coating of the Nature; Karl E. Spear; Journal of the American Ceramic Society vol. 72 No. [2], 1989.

* cited by examiner

*Primary Examiner*—Kathryn Gorgos
*Assistant Examiner*—J. Maisano

(57) ABSTRACT

A method of depositing diamond particles on a surface of a substrate is provided. The method is effected by (a) charging the diamond particles by a positive charge to obtain positively charged diamond particles; and (b) electrophoretically depositing the positively charged diamond particles on the surface of the substrate, for obtaining a green diamond particles coat on the surface of the substrate.

21 Claims, No Drawings

ELECTROPHORETIC DIAMOND COATING AND COMPOSITIONS FOR EFFECTING SAME

FIELD AND BACKGROUND OF THE INVENTION

The invention relates generally to the fabrication of a diamond coating or free standing products and, more particularly, to the fabrication of such coatings on the surface of various substrates, such as of milling cutters, bites (inserts), end mills and drills each having an excellent scale-off (or peeling-off) resistance, various abrasion (wear) resistant members such as valves and bearings, tool steels, as well as substrates acting as heat radiating substrates, such as heat sinks for electronic parts.

As is generally well known, applying a diamond coating to a substrate may be desirable to enhance the performance or to expand the applications of the original (uncoated) substrate.

As used herein, a diamond coating is a coating of carbon primarily in the $SP^3$ phase.

The unique properties of diamond and the possibility to apply a coating thereof on a substrate offer the potential to exploit these properties in a wide range of applications. The combination of the highest hardness and highest thermal conductivity makes diamond a most effective material for abrasive, cutting, shaping and finishing tools. Its high thermal conductivity, high electrical resistance and low thermal expansion make it a preferred choice for spreading and conducting heat out of high power electronic devices. The chemical stability in corrosive environments and high wear resistance make it possible to use diamond as a protective coating in adverse environments.

Synthetic diamonds are produced by high pressure, high temperature techniques since the 1950's. They are now used in cutting, grinding and polishing. However, the development of techniques to produce diamond films and coatings starting with chemical vapor deposition (CVD) in the early 1980's opened up a vast field of applications. The most relevant applications of diamond coating are in the field of working tools and wear resistant coatings. The high thermal conductivity of these films can decrease wear significantly by rapid heat transfer from hot spots caused by frictional heating. Yet, diamond films have small coefficients of friction particularly in low humidity environments. Examples of wear resistant applications of diamond films include machine tool guides, cutting blades, gears, seals, fuel injection nozzles for internal combustion engines, spindle bearings and shafts of milling machines and lathes, computer discs and turbine blades. Medical applications of diamond coatings include surgical knife edges, precision scalpels and surgical implants. Drilling and cutting tools are a vast potential area for diamond coatings on an cutting tool materials. Diamond coated inserts are used for machining non ferrous metals such as high silicon aluminum alloys, copper alloys green ceramics, composite materials including fiber glass and carbon/carbons. Diamond coated inserts can replace conventional inserts in most turning, milling and round tool applications.

Current processing technologies for thin and thick diamond films include chemical vapor deposition (CVD), such as plasma CVD (e.g., DC plasma, RF induction plasma and microwave plasma CVD); non plasma CVD (e.g., hot filament and laser enhanced CVD); and a hybrid process (vapor-liquid-solid (VLS) growth); and an interactive laser technique, also known as the QQC process. Some of these techniques are addressed hereinunder in greater detail.

The major problem areas in diamond coating in which improvement is still needed are lowering substrate temperatures; increasing growth rates; improved adhesion to a variety of substrate materials; control of thickness uniformity on irregular shapes. These problems are further addressed herein. The present invention is directed at providing a solution to all of these problems.

As already mentioned, one area of particular interest is the application of diamond coating to machine tools (e.g., to machine tool cutting inserts). Diamond is especially a tough (hard) material, wears well, and has thermal qualities which are beneficial in many applications. For many machining applications, the qualities of diamond are seemingly unsurpassed by any other available material.

Carbide has long been an established choice for use in cutting tools and inserts, especially for cutting (machining) ferrous, nonferrous or abrasive materials such as aluminum and its alloys, copper, brass, bronze, plastics, ceramics, titanium, fiber-reinforced composites and graphite. Various forms of carbide are known for tools and inserts, such as cobalt-consolidated tungsten carbide (WC/Co).

CVD Processes:

Fabricating diamond coatings utilizing chemical vapor deposition (CVD) processes are well-known. These CVD processes, however, suffer from various shortcomings, including (i) the requirement for a vacuum chamber in which to carry out the process; (ii) the requirement of performing the process in a gaseous environment (typically methane gas, or the like); (iii) "poisoning" of the coating when forming a diamond coating over a cobalt-containing substrate; (iv) the requirement to preheat the substrate; (v) the requirement of a pressurized environment; and (vi) relatively low rates of deposition.

Certain enhancements to the CVD process have been proposed, including the use of microwave plasma enhanced (MWPE) CVD process which takes place at relatively low temperatures and pressures, as compared with conventional PCD fabrication methods which utilize High Pressure and High Temperature ("HPHT") techniques. Using these processes, any insert shape can reportedly be uniformly coated, and the coated inserts can have sharp edges and chip-breaker geometries. Hence, these inserts are indexable and can provide from two-to-four cutting corners.

CVD-coated tools tend to have a relatively thin diamond layer (typically less than 0.03 mm), which tends to allow the toughness of the underlying substrate material to dominate in determining overall tool strength, even when shock-loaded. Hence, these CVD inserts tend to be able to handle a larger depth of cut (DOC).

A critical concern with any coated tool or insert is that the coating should exhibit good adhesion to the underlying base material (e.g., carbide).

Concerns with the prior art include (i) delamination (catastrophic failure); (ii) adhesive and abrasive wear resistance (diamond is often used as a milestone for evaluating wear resistance); (iii) toughness (carbide is often used as a milestone for evaluating toughness); (iv) flank wear; (v) Built Up Edge (BUE) heat; and (vi) edge integrity.

The coating should also be compatible with the material contemplated to be machined. For example, polycrystalline diamond coatings tend to have a very low corrosion resistance to the resins in certain composite plastics.

Another area of concern with respect to diamond coatings on tools is that a very hard diamond coating on a softer tool is very prone to failure from stress.

An area of paramount concern is poor adhesion, which would appear to be a result from the reliance of prior art diamond coatings on the mechanism of molecular bonding, as well as from instabilities inherent in formation of the diamond coating.

An example of a CVD coating process is growing diamond by reacting hydrogen and a hydrocarbon gas, such as methane, in a plasma and synthesizing a diamond structure either as a coating or a free-standing blank. Carbide tools may be coated with a thin film of diamond using closed-chamber arc plasma CVD.

There are a number of basic CVD deposition processes currently in use, for depositing diamond coatings. Generally, these processes involve dissociation and ionization of hydrogen and methane precursor gases, which are then passed over and deposited onto a heated substrate.

The need to heat the substrate in order to apply the coatings is, in many ways, counterproductive. Such application of heat can cause distortion of the substrate, and the loss of any temper (heat treatment) that had previously been present in the substrate.

For example, in the hot filament CVD method, a tungsten or tantalum filament is used to heat the precursor gases to about 2000° C. Substrate temperature ranges from 600°–1100° C. Using hydrogen and methane precursors, deposition rates of 1–10 $\mu$m per hour are possible.

In DC plasma CVD, a DC (direct current) arc is used to dissociate the precursor gases, and can provide higher gas volumes and velocities than other prior art processes.

Microwave CVD uses microwaves to excite the precursor gases, resulting in deposition rates of several microns per hour. Coatings deposited using this method are of very high purity, closer to pure diamond than the other techniques.

In the CVD process there is a need to significantly elevate the temperature of the substrate. Furthermore, there is a significant (2–5 hour) cooling time, during which time residual precursors (gas) deposit, like snowflakes, on the surface being coated. This results in a coating which has a very rough surface, as compared to the pre-coated surface, and which typically requires post-processing to achieve a smoother surface.

In addition, when depositing a diamond coating, e.g., from a vapor phase, an amorphous coating is typically formed, containing either $SP^2$-bonded carbon or $SP^2$-bonded carbon and $SP^3$-bonded carbon, with higher concentration of hydrogen.

CVD processes are generally limited in suitability to coating flat planar surfaces, or simple (non-complex geometry) round surfaces.

The size of the substrate that can be coated is limited by the size of the vacuum chamber in which the process is carried out; the size of the substrate is typically less than eight inches in diameter.

Inasmuch as these processes tend to rely primarily on a precipitation-type (i.e., generally directional deposition) mechanism, the "other" side of the substrate may exhibit shadowing or uneven deposition.

Irrespective of the process involved in applying a coating to a substrate, the end-product may still provide unacceptable results. For example, applying a thin hard coating over a soft substrate will result in very poor stress distribution.

Prior art coating processes tend to be limited to forming a thin film (or layer) on a substrate. This is somewhat analogous to rain falling on a lawn and freezing. The resulting ice layer is relatively hard, but is thin, and there is an abrupt transition of hardness from the thin ice layer (coating) to the underlying grass (substrate). This will result in extremely poor stress distribution, as a result of which the thin layer of ice is subject to cracking when stress is applied. Generally, the thickness of the coating will reflect upon the stresses that build up in the coating.

CVD coatings are typically grainy, although they can be post-process finished to provide a surface of desired smoothness. However, in order to perform such post-finishing, a diamond must be employed. Further, as in any abrasive process, there will be directional scratches, albeit microscopic, evident in the final surface finish of the coating.

Diamond is a material of choice for coating tools because of its extreme hardness (9000 $kg/mm^2$) and its low coefficient of friction (0.05). However, regardless of the substrate material (e.g., cemented carbide) adhesion of diamond coatings has been a barrier to its widespread application. In the case of carbide substrates, these adhesion problems are augmented by the cobalt binder phase found in carbide tools which essentially "poisons" the diamond nucleation and growth process, resulting in formation of graphitic carbon (which is undesirable).

Attention is directed to the following U.S. patents, incorporated by reference herein, as indicative of the state of the art of diamond coating: U.S. Pat. Nos. 5,273,790; 5,273,825; 5,271,971; and 5,270,077 ('077). The '077 patent, for example, discloses contacting a heated substrate with an excited gaseous hydrogen and hydrocarbon mixture under conditions of pressure, temperature and gas concentration which promote the growth of a diamond coating on a convex growth surface of the substrate, then separating the diamond coating from the convex growth surface, to provide a flat diamond film. The diamond coating separated from the substrate is under stress, and may require further processing for certain applications. Due to internal residual stresses, the diamond layer may also be deformed.

Generally, the prior art techniques for applying a diamond coating to a substrate (e.g., tool insert), although useful, suffers from one or more of the following limitations (i) the CVD deposition rate is limited to approximately 0.5 $\mu$m–10 $\mu$m per hour; (ii) the diamond coating exhibits poor adhesion (e.g., 30 kg/mm $^2$) on carbide substrates with higher cobalt content, requiring specialty substrates or other surface treatment; (iii) the processes are generally directed to the formation of amorphous DLC coatings only, containing $SP^2$ and/or $SP^3$ and non-diamond carbon phases (e.g., graphite); (iv) The CVD process typically requires the substrate to be heated to 450°–1000° C., to enable coating growth and bonding, which can distort the substrate and which can add significant on-line time (e.g., 2 hours) to the process; (v) the processes must be performed in a vacuum chamber, such as a belljar, which adds complexity to the process and which severely limits the size of the substrate to be coated; (vi) stainless steel and steel cannot be easily coated using these processes; (vii) the processes are generally not well-suited to coating large surfaces, or surfaces with complex geometries.

These and other limitations of the prior art are addressed by the techniques of the present invention, which do not depend upon a vacuum environment, and which do not require preheating the substrate to perform the basic coating.

Laser Processes:

Attention is directed to the following U.S. Patents, incorporated by reference herein, as representative of processes utilizing lasers to form, or to assist in forming, diamond or DLC coatings, crystals, or structures:

U.S. Pat. No. 5,273,788, which discloses a layer of a hydrocarbon molecule applied to a substrate by the Langmuir-Blodgett technique, and the surface is irradiated with a laser to decompose the layer of molecules at the surface without influencing the substrate; U.S. Pat. No. 5,236,545, which discloses a process involving the deposition of a cubic boron nitride (CBN) layer on a silicon substrate as a first interfacial layer using laser ablation with a hexagonal boron nitride target in a nitrogen-containing atmosphere., followed by a second interfacial layer of hydrogen terminated carbon which is deposited with laser ablation with a carbon target in the presence of atomic hydrogen, followed by deposition of a heteroepitaxial diamond film using convention al chemical vapor deposition (CVD) technique; U.S. Pat. No. 5,176,788, which discloses the use of pulsed laser light to join diamond structures together. The process includes forming a layer of opaque non-diamond material between the two diamond surfaces to be joined, pressing the diamond surfaces together, using the pulsed laser light to quickly melt all the opaque nondiamond carbon material before a significant amount of heat is lost through the diamond surface, then allowing the resulting carbon melt to cool and solidify as polycrystalline diamond which grows homoepitaxially from the diamond surfaces, bonding those surfaces together; U.S. Pat. No. 5,154,945, which discloses the use of infrared lasers to deposit diamond thin films onto a substrate. In one embodiment, the deposition of the film is from a gas mixture of $CH_4$ and $H_2$ that is introduced into a CVD chamber and caused to flow over the surface of the substrate to be coasted while the laser is directed onto the surface. In another embodiment, pure carbon in the form of soot is delivered onto the surface to be coated and the laser beam is directed onto the surface in an atmosphere that prevents the carbon from being burned to $CO_2$; U.S. Pat. No. 5,080,752, which discloses a process in which particles of transparent diamond powders are bonded together by polycrystalline diamond to form useful diamond structures. An intimate mixture of fine opaque nondiamond carbon powder and transparent diamond powder is pressed together to form a green body that is confined in either a thin walled transparent quartz vessel or a polycrystalline diamond coating, and a pulse laser is used to quickly melt the opaque nondiamond carbon powder. Then, the carbon melt is allowed to cool and grow homoepitaxially from the surfaces of the diamond particles, producing a polycrystalline diamond that bonds the diamond particles together; U.S. Pat. No. 5,066,515, which discloses a method of forming an artificial diamond comprising applying a laser beam to a glassy solid carbon material while moving a point on the glassy solid carbon material at which the laser beam is applied, to form a locally fused portion thereon, whereby every part of the locally fused portion is cooled as the point moves away therefrom. During cooling of the locally fused portion, an artificial diamond is formed in adjacent regions on both sides of the solidified locally fused portion; U.S. Pat. No. 4,986,214, which discloses a thin-film forming apparatus capable of forming thin diamond films. The process is a laser CVD process in which thin-film forming gases are optically dissociated by high energy photons released form an ultraviolet laser beam; U.S. Pat. No. 4,981,717, which discloses generating a plasma by a laser pulse. The pulse is fired into a gas and is absorbed in an initiater mixed with the gas. The resulting detonation produces a plasma of ions, radicals, molecular fragments and electrons which is propelled by the detonation pressure wave to a substrate and deposited thereon; U.S. Pat. No. 4,954,365, which discloses preparing a thin diamond film by immersing a substrate in a liquid containing carbon and hydrogen, and then subjecting the substrate to at least one laser pulse; U.S. Pat. No. 4,948,629, which discloses depositing diamond films by CVD using a high powered pulsed laser and a vapor which is an aliphatic carboxylic acid or an aromatic carboxylic anhydride; U.S. Pat. No. 4,874,596, which discloses directing an intense radiation beam into a cavity supporting a small quantity of material to be reacted on. Two or more intense radiation beams, such as generated by one or more lasers or electron guns, are directed against a particle or pellet of material from opposite directions, causing shock waves which collapse against the pellet material, transforming it into another form. The pellet or particles may comprise carbon, which is converted to diamond by the intense heat and force of the shock wave(s); and U.S. Pat. No. 4,849,199, which discloses suppressing the growth of graphite and other non-diamond carbon species during the low pressure deposition of carbon to form diamond. The graphite or other non-diamond species is vaporized using incident radiative energy sufficient to vaporize graphite but insufficient to damage the substrate. The growth of graphite and other non-diamond species is suppressed during deposition of diamond by exposing growing surfaces to incident radiative energy of a wavelength sufficient to selectively photolyze non-diamond carbon-carbon bonds formed at the surface of the growing diamond; U.S. Pat. No. 4,522,680, which discloses a method of producing diamond crystals by providing a pressure-resistant body having a nucleus of a starting material being crystallized in the inside thereof. The nucleus is applied with an energy which is capable of passing through the pressure-resistant body and being absorbed by the starting material, by which the nucleus is heated and melts. The melt is then gradually cooled under pressure to form crystals. A laser beam or high frequency induction heating technique is used for heating the nucleus.

These processes fall short of meeting the objectives of the present invention in various ways.

What is needed is a method and apparatus for commercially and economically treating and/or fabricating objects to obtain a desired composite material. Furthermore, it is desirable to improve the deposition rate, bond strength, adhesion, process time, area of growth, and material strength. Furthermore, it is desirable to produce an object having a desired composite material so as to permit effective engineering evaluation of material strength and production of parts and produce parts that exhibit surfaces having precise dimensions according to engineering data.

EPD Processes:

Electrophoretic deposition of diamonds has been applied so far only for predepositing a nucleating layer of diamonds ("seeding") for CVD of diamond films. Thus, U.S. Pat. No. 5,128,006 describes a method for attaining uniform and adherent CV deposition of diamond layers on a silicon substrate by predepositing a nucleating layer of diamond particles using an electrophoretic technique. The invention disclosed in U.S. Pat. No. 5,128,006 relates also to use of masking techniques so the predeposited layers can be patterned. The inventors described the electrophoretic seeding technique in a paper in J. Electrochem. Soc. Vol. 138, No 2, 1991 p. 635.

Doug-Gu and Singh described synthesis of oriented diamond films using controlled seeding of diamond particles by electrophoresis (Appl. Phys. Lett. 70, (12) March 1997 p. 1542) on silicon substrates. The film was then grown by hot filament CVD.

In both cases very low concentrations of diamond particles were used (0.1–0.2 g/l) to obtain less than or equal to one monolayer with partial coverage of substrate surface.

At Sandia National Laboratories (SNL), Panitz et al. (Journal of Vacuum Science and Technology A12(4), pp. 1480–1486, 1994) formed diamond powder precursors on nickel sheets and silicon wafers by two methods: electrophoretic deposition and screen printing. They then densified these precursors using a CVD hot filament assisted reactor. The EPD was carried out from isopropanol suspensions containing 2.5% by weight diamond powder, at 1000 volts across a spacing of 1.5 cm. The substrate acted as an anode, since the diamond particles acquired a negative charge. The suspension was sonicated for 1 hr with a 40 KHz ultrasonic cleaner in order to yield stable active dispersions with reproducible properties. The suspensions had to be periodically sonicated. In this method the diamond particles tend to deposit on high field areas first. Conformal coatings form on shaped substrates after a certain amount of processing time. In addition, dispersions with more than 2.5% wt diamond tend to be unstable. Panitz et al. found that coatings thicker than 200–250 micron cannot be electrophoretically deposited.

There is thus a widely recognized need for, and it would be highly advantageous to have, a method for diamond coating devoid of the limitations of the prior art, and which has advantages in the following directions: lowering substrate temperatures; increasing growth rates; improving adhesion to a variety of substrate materials; control of thickness uniformity on irregular shapes.

SUMMARY OF THE INVENTION

It is therefore an object of the present invention to provide an improved technique for fabricating diamond coating on a substrate, or as a free standing product.

It is a further object of the present invention to provide an improved technique for fabricating diamond coating on a substrate while lowering substrate temperatures; increasing growth rates; improving adhesion of the coating to a variety of substrate materials; controlling thickness uniformity of substrates featuring irregular shapes.

It is a further object of the present invention to provide a technique for forming diamond coating on substrates of various compositions (e.g., steel, stainless steel, carbide steel), which coatings exhibit superior adhesion to the substrate, as well as relatively great thickness and rate of fabrication.

It is a further object of the present invention to provide a technique for fabricating a diamond coating on a substrate using a process that may be carried out in an ambient (non-vacuum) environment.

It is a further object of the present invention to provide a technique for fabricating a diamond coating on a substrate containing a significant amount of cobalt.

It is a further object of the present invention to provide a technique for fabricating a diamond coating on a substrate of all steel alloys, including stainless steels, and carbide steels.

It is a further object of the present invention to provide a technique for fabricating diamond coatings on substrates having complex geometry.

It is a further object of the present invention to provide a technique for fabricating a diamond coating on a tool or insert, especially a cutting tool.

It is a further object of the present invention to provide a technique for coating a tool or insert, especially a cutting tool, especially with diamond coating, in a manner that is robust with respect to carbide, even with relatively high cobalt concentrations, as well as with high speed steel alloys and other cutting tool materials, and in a manner that can be performed at room temperatures and pressures.

It is a further object of the present invention to provide a technique for improving the adhesion of a diamond coating to a substrate, in a manner that is robust with respect to carbide, and in a manner that can be performed at room temperatures and pressures.

It is a further object of the present invention to provide a technique for treatment and fabrication of materials to produce an object having a diamond surface.

Thus, according to the present invention there is provided a method of depositing diamond particles on a surface of a substrate, the method comprising the steps of (a) charging the diamond particles by a positive charge to obtain positively charged diamond particles; and (b) electrophoretically depositing the positively charged diamond particles on the surface of the substrate, for obtaining a green diamond particles coat on the surface of the substrate.

According to further features in preferred embodiments of the invention described below, the method of claim 1, further comprising the step of (c) consolidating the green diamond particles coat by a gas-phase deposition method.

According to still further features in the described preferred embodiments the gas-phase deposition method is selected from the group consisting of chemical vapor deposition (CVD) and an interactive laser technique.

According to still further features in the described preferred embodiments the chemical vapor deposition (CVD) is selected from the group consisting of plasma CVD, non plasma CVD and a hybrid process of vapor-liquid-solid (VLS) growth According to still further features in the described preferred embodiments the plasma CVD is selected from the group consisting of DC plasma CVD, RF induction plasma CVD and microwave plasma CVD.

According to still further features in the described preferred embodiments the non plasma CVD is selected from the group consisting of hot filament CVD and laser enhanced CVD.

According to still further features in the described preferred embodiments the method further comprising the step of (c) consolidating the green diamond particles coat by electroplating or electroless plating.

According to still further features in the described preferred embodiments the electroplating or electroless plating is by a metal.

According to still further features in the described preferred embodiments the metal is selected from the group consisting of nickel, copper, gold, silver and cobalt.

According to still further features in the described preferred embodiments the diamond particles have a size ranging from 0.01 micron to 50 microns.

According to still further features in the described preferred embodiments the diamond particles have a size ranging from 0.5 micron to 1 micron, 1–4 microns or 4–12 microns.

According to still further features in the described preferred embodiments the diamond particles include particles of at least two distinct dimensions.

According to still further features in the described preferred embodiments charging the diamond particles by the positive charge is effected by suspending the diamond particles in a polar liquid in the presence of a proton generating additive.

According to still further features in the described preferred embodiments the polar liquid is selected from the group consisting of water and/or a polar organic liquid.

According to still further features in the described preferred embodiments the polar organic liquid is selected from the group consisting of ethanol, methanol, isopropanol, methyl ethyl ketone and acetone.

According to still further features in the described preferred embodiments the proton generating additive is an acidic buffer.

According to still further features in the described preferred embodiments the proton generating additive is selected from the group consisting of iodine-acetone-water, phosphate ester, polyvinyl butiral and/or acetyl acetone.

According to still further features in the described preferred embodiments charging the diamond particles by the positive charge is effected by suspending the diamond particles in an inorganic acid.

According to still further features in the described preferred embodiments charging the diamond particles by the positive charge is effected by suspending the diamond particles in a polar liquid in the presence of a cation generating additive.

According to still further features in the described preferred embodiments charging the diamond particles by the positive charge is effected by suspending the diamond particles in a solution of $AlCl_3$.

According to still further features in the described preferred embodiments electrophoretically depositing the positively charged diamond particles on the surface of the substrate is effected under constant current.

According to still further features in the described preferred embodiments the constant current is in a range of 0.1–3.0 milliampere per centimeter squared.

According to still further features in the described preferred embodiments electrophoretically depositing the positively charged diamond particles on the surface of the substrate is effected under constant voltage.

According to still further features in the described preferred embodiments the constant voltage is in a range of 20–800 volts per centimeter.

According to still further features in the described preferred embodiments the substrate is selected from the group consisting of a metal, a metallic alloy, a semiconductor substrate, a conductive carbide and a metallized non-conductive ceramic material.

According to still further features in the described preferred embodiments while electrophoretically depositing the positively charged diamond particles on the surface of the substrate, a diamond particles concentration is between 5–200 grams per liter.

According to still further features in the described preferred embodiments while electrophoretically depositing the positively charged diamond particles on the surface of the substrate, a diamond particles concentration is between 30–120 grams per liter.

Further according to the present invention there is provided a suspension comprising positively charged diamond particles in a suspending liquid.

According to still further features in the described preferred embodiments the suspending liquid is a polar liquid.

The present invention successfully addresses the shortcomings of the presently known configurations by providing an effective and efficient method and suspension for diamond coating.

DESCRIPTION OF THE PREFERRED EMBODIMENTS

The present invention is of method and composition which can be used the fabrication of diamond coatings or free standing products. Specifically, the present invention can be used for the fabrication of such coatings under ambient temperature and pressure conditions, in increased growth rate, featuring improved thickness control and uniformity on irregular shapes, over a variety of substrate materials. Most specifically, the present invention can be used for the fabrication of such coatings on the surface of substrates, such as of milling cutters, bites (inserts), end mills and drills each having an excellent scale-off (or peeling-off) resistance, various abrasion (wear) resistant members such as valves and bearings, and substrates acting as heat sinks for electronic parts.

The principles and operation of a method and composition according to the present invention may be better understood with reference to the accompanying descriptions and examples.

Before explaining at least one embodiment of the invention in detail, it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

Electrophoretic deposition (EPD) is a process in which charged particles suspended in a liquid medium are attracted and deposited on an electrode with an opposite charge when an electric field is imposed on the particles.

According to the present invention there is provided a method of depositing diamond particles on a surface of a substrate. The method according to the present invention is effected by implementing the following method steps, in which, in a first step the diamond particles are charged by a positive charge to obtain positively charged diamond particles. Thereafter, in a second step of the method, the positively charged diamond particles are electrophoretically deposited on the surface of the substrate, for obtaining a green diamond particles coat on the surface of the substrate.

While reducing the present invention to practice it was found that when appropriately charged and suspended in an appropriate liquid, as further detailed hereinunder, diamond particles can be deposited on a chosen substrate to form a coating composed of discrete diamond particles. The typical "green" density of such a coating is about 60–70% volume percent.

Thus, the diamond particles according to the present invention are charged with a positive charge and are used for cathophoretic deposition. Cathodic deposition is presently preferred because no loss of metal substrates is experienced at the cathode, whereas such loss is typically characterizing the anode.

The size of the diamond particles according to the present invention can be in the range of 0.5–1.0 microns or less. However, for some applications larger or smaller particles in the submicron (e.g., 0.01–0.5 microns) or tenths of microns (e.g., 10–50 microns) ranges are preferred. Polydispersive suspensions of diamond particles (containing at least two sizes distributions of particles e.g., powder with typical size of 0–1 micron, 2–4 micron and 5–10 microns) can also be used.

According to preferred embodiments of the present invention, while electrophoretically depositing the positively charged diamond particles on the surface of the substrate the diamond particles are used at a concentration of 5–200 grams per liter, preferably, 30–120 grams per liter. Agitation of the suspension can be performed by sonication using an ultrasound dismembrator followed by stirring of the suspension.

According to one embodiment of the present invention charging the diamond particles by the positive charge is effected by suspending the diamond particles in a polar liquid in the presence of a proton generating additive. The proton generating additive according to the present invention can be an acidic buffer, inorganic acid, an additive of iodine-acetone-water, phosphate ester, polyvinyl butiral and/or acetyl acetone additive.

Addition of phosphate esters, such as, but not limited to, Emphos, in combination with acetone and iodine was shown to be beneficial for film quality as it generates a smoother surface.

Yet, according to another embodiment of the present invention, charging the diamond particles by the positive charge is effected by suspending the diamond particles in a polar liquid in the presence of a cation generating additive. $AlCl_3$ dissolved or suspended in ethanol or isopropyl alcohol provides an example of a cation generating additive which was found to be highly effective in positively charging diamond particles according to the present invention.

The mechanisms underlying the activity of some of these additives in charging the diamond particles according to the present invention are further described hereinunder.

In any case, and as further exemplified in the Examples section that follows, charging can be effected either as a pretreatment or directly in the suspension subjected to electrophoretic deposition. For example, pretreatment with an inorganic acid includes exposing the diamond particles to an inorganic acid such as, but not limited to, hydrochloric acid (HCl, which dissociated to $H^+$ and $Cl^-0$ ions), stirring, filtering and washing with deionized water. As a result, the diamond particles are positively charged by protons ($H^+$ ions).

The polar liquid according to the present invention which is used to suspend the diamond particles according to the present invention can be, for example, water or a polar organic liquid. Suitable polar organic liquids include, but are not limited to, ethanol, methanol, isopropanol, methyl ethyl ketone and acetone.

The deposition of the diamond particles according to the present invention can be carried out at a constant current, e.g., in the range of 0.1–3.0 milliampere per centimeter squared or a constant voltage, e.g., 20–800, preferably 50–500 volts per centimeter.

The substrate onto which the diamond particles according to the present invention are deposited can be a metal or metallic alloy (e.g. steel, stainless steel, copper), a semiconductor substrate, a conductive carbide (e.g. tungsten carbide silicon carbide), or a non-conductive ceramic material (such as silicon nitride), in which case a metallization treatment has to be performed prior to the electrophoretic deposition of the particles. In all cases the substrate serves as an cathode (i.e., a negatively charged electrode with attracts positively charged particles).

A metallization treatment of the substrate according to the present invention can be performed, as well known in the art, by conventional metal sputtering.

The deposit obtained under the above specified conditions is typically porous and with inferior mechanical properties.

The consolidation of the coating is obtained according to he present invention by any appropriate gas-phase deposition method or by electroplating or electroless plating to thereby achieve coating of the desired density without residual porosity affecting the mechanical properties.

Thus, consolidation of the diamond coating, which results in an increase in density and mechanical properties of the coating, is achieved according to a preferred embodiment of the present invention by applying a chemical vapor deposition technique or any other gas-phase deposition method by which the electrophoretically deposited particles will grow further, acting as nucleating centers. As used herein the term "gas-phase deposition method" includes chemical vapor deposition (CVD), such as plasma CVD (e.g., DC plasma, RF induction plasma and microwave plasma CVD); non plasma CVD (e.g., hot filament and laser enhanced CVD); and a hybrid process (vapor-liquid-solid (VLS) growth); and an interactive laser technique, also known as the QQC presses.

Yet alternatively or additionally, the consolidation of the diamond coating, which results in an increase in density and mechanical properties of the coating, is achieved according to another preferred embodiment of the present invention by metal electroplating or electroless plating, e.g., nickel, copper, gold, silver and/or cobalt electroplating or electroless plating.

The procedure for obtaining of composite Ni-diamond coating depends on the specific application. Ni coatings are well-known in their ability to bond diamond particles to different substrates, due to their good wetting of the diamond particles. The procedure includes etching the chosen substrate in a mixture of acids followed by sand blasting with $Al_2O_3$ particles at a pressure of 4 atmospheres, prior to the deposition.

Ni is then electroplated during a period of about 30 minutes from a mixture of salts (see Example 5), after which a suitable heat treatment follows. The heat treatment improves the adhesion of the Ni to the substrate and enables the elimination of pores.

Further according to the present invention there is provided a suspension of diamond particles including positively charged diamond particles in a suspending liquid, typically a polar liquid.

Among the advantages of the present invention over the prior art are (i) high cost effectiveness due to inexpensiveness of electrophoretic deposition equipment and raw materials; (ii) fast deposition rates, e.g., 100 times faster as compared with microwave plasma CVD, of uniform and thick depositions even on substrates featuring irregular shapes, such as intricately shaped objects; and (iii) applicability to a wide variety of substrate materials.

In sharp distinction with the method by Panitz et al. (Journal of Vacuum Science and Technology A12(4), pp. 1480–1486, 1994) which is based on an anionic deposition process, the method according to the present invention is based on a cathodic deposition process. The charge of the particles is positive and is acquired by a mechanism of adsorption of protons or other cations. The cathodic deposition is advantageous due to the fact that the substrate does not dissolve in the suspension, while during anodic deposition, metallic substrates are likely to dissolve. A cathodic process therefore enables deposition on a wider variety of substrates.

Other advantages of cathodic deposition are improved adhesion to the substrate and better green density (the range of 65–70%) than in anodic deposition (green density in the range of 50–55%). In addition, the method described herein results in a stable, reproducible deposition process, as well as uniform coverage of a shaped substrate, as opposed to the process by Panitz et al. which does not include additives for charging and results in anionic deposition. The deposits obtained implementing the method of the present invention are uniform and smooth. In addition, no prolonged and repeated sonication is needed as is the case according to Panitz et al.

Additional objects, advantages, and novel features of the present invention will become apparent to one ordinarily skilled in the art upon examination of the following examples, which are not intended to be limiting. Additionally, each of the various embodiments and aspects of the present invention as delineated hereinabove and as claimed in the claims section below finds experimental support in the following examples.

EXAMPLES

Reference is now made to the following examples, which together with the above descriptions, illustrate the invention in a non limiting fashion.

Example 1

Thick layers of diamond particles were obtained by electrophoretic deposition from a suspension of 3.2 g of diamond powder (GE, MBM 2–4) in 80 ml of ethyl alcohol. The suspension was sonicated for 10 min (using an ultrasound sonicator of Fischer, 43 KHz) after which 15 mg of iodine, 2 ml of acetone and 1 ml of water were added and the suspension was stirred for 10 minutes. 30 μl of phosphate ester were then added in order to achieve a smoother deposition surface.

After 24 hours, the suspension was transferred to an electrophoretic cell, which contained a cylindrical Ni anode (internal diameter of 40 mm). 200 volts were applied for a period of one minute in order to deposit the diamond particles on top of an Si substrate (10×11×0.65 mm$^3$) placed in the center of the cylinder anode and which served as a cathode. A layer of 50 microns in thickness was deposited on the cathode, having a green density of about 70%.

The diamond layer thus obtained was introduced into a CVD reactor and a hot filament CVD process (HFCVD) was affected for 10 hours. The process was carried out with an atmosphere of 99% $H_2$ and 1% $CH_4$, at a pressure of 30 torr and a temperature of 850° C. (The process can be performed by microwave plasma CVD as well). No pretreatment was carried out on the substrate although such a treatment is essential in many cases. The resulting diamond layer was planar, adhered to the substrate and the diamond particles were wrapped with a CVD diamond cover around them.

Example 2

A suspension of 3.2 grams diamond powder (De beers, 6–12 micron) and 10 mg of $AlCl_3$ in 80 ml of iso-propyl alcohol was sonicated for 10 minutes using an ultrasound sonicator of Fischer at 43 KHz. The suspension was allowed to cool for 20 minutes to room temperature with continuous stirring. The suspension was then placed in an electrophoretic cell as described under Example 1 hereinabove. A WC plate, pretreated to remove cobalt from its surface, was dipped in the suspension, serving as the cathode. Deposition was performed under a constant current regime of 2 mA for 50 seconds. A layer of 40 microns in thickness of diamond particles with 60% green density was received.

The CVD process that followed was the same as in Example 1 but it prolonged only 5 hours. The resulting diamond layer was planar, adhered to the substrate and the diamond particles were wrapped with a CVD diamond cover around them.

Example 3

Cathodic deposition of diamonds was obtained also by pretreating 6 g of diamonds in a solution of 6 grams of $AlCl_3 \cdot 6H_2O$ in 50 ml deionized water. Stirring for 30 min was applied, then the solution was brought to boiling and the water evaporated. After evaporation, the diamonds were washed with deionized water until no $Cl^-$ ions were detected in the washing media by 1M $Ag(NO)_3$ solution. Such pretreated diamonds deposited readily from aqueous suspensions. For non aqueous solutions such as isopropyl alcohol a phosphate ester additive (Emphos) at a concentration of 1% was added to obtain reasonable deposition rates.

Example 4

It is shown herein for the first time that the absorption of positive charges by diamond particles takes place in the presence of protons ($H^+$) and certain metallic cations, such as $Al^{3+}$.

The following positive charging processes were found highly efficient:

(a) The addition of acetone, iodine and water to an alcoholic suspender, results in positive changing of the diamond particles by the following mechanism:

The ketone molecule (acetone) exhibits a keto-enolic equilibrium:

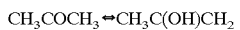

$$CH_3COCH_3 \leftrightarrow CH_3C(OH)CH_2$$

The enolic form reacts with the iodine to form HI:

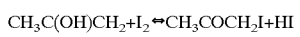

$$CH_3C(OH)CH_2 + I_2 \leftrightarrow CH_3COCH_2I + HI$$

The HI hydrolyzes to form H+:

$$HI \leftrightarrow H^+ + I^-$$

The $H^+$ ions thus formed adsorb to the diamond particles to form a monolayer of positive charges thereon.

The addition of water is necessary to create ionic conductivity which enables the hydrolysis of the HI as described and movement of the charged diamond particles to deposit on the cathode.

(b) Aluminum chloride added to the suspender fulfills two functions. It dissociates to form $Al^{3+}$ ions:

$$AlCl_3 \leftrightarrow Al^{3+} + 3Cl^-$$

The $Al^{3+}$ ions adsorb on the diamond particles and leads to cathophoretic deposition. In addition a polymeric hydroxide of aluminum is formed at the cathode and acts as a binder for the deposit.

(c) Emphos additive, a phosphate ester, also causes positive charging of diamond particles. The mechanism is:

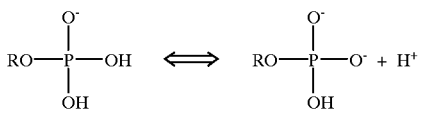

H⁺ ions adsorb to the diamond particles, whereas the anionic end of the amphipatic molecule is attracted to the positively charged particles, thereby increasing the repulsion among the particles by a steric effect and thus increasing the stability of the suspension.

Example 5

A steel plate substrate is sand blasted with $Al_2O_3$ particles of 100–250 µm in diameter at a pressure of 4 atmospheres. The substrate is then etched in two solutions; HCl (250 g/l) followed by $Cr_2O_3$ (150 g/l) mixed with $H_2SO_4$ (20 g/l). A preliminary Ni plating is performed ($NiCl_2$+HCl), followed by an EPD process for diamond deposition as in Example 1 above. The green coating is then subjected to an electroplating process using a solution of $NiSO_4$ (300 g/l), $NiCl_2$ (50 g/l) and $H_3BO_4$ (40 g/l), pH. 4.2 as an electrolyte, at a temperature of 40° C. and current density of 3 Ampere/dm², for a period of 20 minutes. A heat treatment under $N_2$ atmosphere at 300° C. for 3 hours finishes the process.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

What is claimed is:

1. A method of depositing diamond particles on a surface of a cathodic substrate, the method comprising the steps of:
    (a) charging the diamond particles by a positive charge by suspending the diamond particles in a polar organic liquid in the presence of cation a generating additive so as to obtain a suspension of positively charged diamond particles; and
    (b) from said suspension electrophoretically depositing said positively charged diamond particles on the surface of the cathodic substrate by application of voltage in a range of 50–800 volts for obtaining a green diamond particles coat on the surface of the cathodic subtrate.

2. The method of claim 1, further comprising the step of:
    (c) consolidating said green diamond particles coat by a gas-phase deposition method.

3. The method of claim 2, wherein said gas-phase deposition method is selected from the group consisting of chemical vapor deposition (CVD) and an interactive laser technique.

4. The method of claim 3, wherein said chemical vapor deposition (CVD) is selected from the group consisting of plasma CVD, non plasma CVD and a hybrid process of vapor-liquid-solid (VLS) growth.

5. The method of claim 4, wherein said plasma CVD is selected from the group consisting of DC plasma CVD, RF induction plasma CVD and microwave plasma CVD.

6. The method of claim 4, wherein said non plasma CVD is selected from the group consisting of hot filament CVD and laser enhanced CVD.

7. The method of claim 1, further comprising the step of:
    (c) consolidating said green diamond particles coat by electroplating or electroless plating.

8. The method of claim 7, wherein said electroplating or electroless plating is by a metal.

9. The method of claim 8, wherein said metal is selected from the group consisting of nickel, copper, gold, silver and cobalt.

10. The method of claim 1, wherein the diamond particles have a size ranging from 0.01 micron to 50 microns.

11. The method of claim 10, wherein the diamond particles have a size selected from the group consisting of 0.5 micron to 1 micron, 1 micron to 4 microns and 4 microns to 12 microns.

12. The method of claim 1, wherein the diamond particles include particles of at least two distinct dimensions.

13. the method of claim 1, wherein said polar organic liquid is selected from the group consisting of ethanol, methanol, isopropanol, methyl ethyl ketone and acetone.

14. The method of claim 13, wherein said proton generating additive is an acidic buffer.

15. The method of claim 13, wherein said proton generating additive is selected from the group consisting of iodine-acetone-water, phosphate ester, polyvinyl butiral and/or acetyl acetone.

16. The method of claim 1, wherein electrophoretically depositing said positively charged diamond particles on the surface of the substrate is effected under constant current.

17. The method of claim 16, wherein said constant current is in a range of 0.1–3.0 milliampere per centimeter squared.

18. The method of claim 1, wherein electrophoretically depositing said positively charged diamond particles on the surface of the substrate is effected under constant voltage.

19. The method of claim 1, wherein said substrate is selected from the group consisting of a metal, a metallic alloy, a semiconductor substrate, a conductive carbide and a metallized non-conductive ceramic material.

20. The method of claim 1, wherein while electrophoretically depositing said positively charged diamond particles on the surface of the substrate, a diamond particles concentration is between 5–200 grams per liter.

21. The method of claim 20, wherein while electrophoretically depositing said positively charged diamond particles on the surface of the substrate, a diamond particles concentration is between 30–120 grams per liter.

* * * * *

UNITED STATES PATENT AND TRADEMARK OFFICE
CERTIFICATE OF CORRECTION

PATENT NO.   : 6,258,237 B1
DATED        : July 10, 2001
INVENTOR(S)  : Gal-Or et al.

It is certified that error appears in the above-identified patent and that said Letters Patent is hereby corrected as shown below:

<u>Title page,</u>
Item [73], Assignees: change "Cerd, Ltd., Nesher; Iscer, Ltd., Tefen, both of (IL)" to
-- Cerel, Ltd., Nesher; Iscar, Ltd., Tefen, both of (IL) --

Signed and Sealed this

Seventeenth Day of September, 2002

Attest:

JAMES E. ROGAN
Attesting Officer           Director of the United States Patent and Trademark Office